United States Patent
Yang

(10) Patent No.: US 8,005,125 B2
(45) Date of Patent: Aug. 23, 2011

(54) LIGHTING DEVICE EQUIPPED WITH COAXIAL LINE LASER DIODES AND FABRICATION METHOD THEREOF

(76) Inventor: Chun-Chu Yang, Kaohsiung (TW)

( * ) Notice: Subject to any disclaimer, the term of this patent is extended or adjusted under 35 U.S.C. 154(b) by 0 days.

(21) Appl. No.: 12/276,452

(22) Filed: Nov. 24, 2008

(65) Prior Publication Data

US 2009/0135877 A1    May 28, 2009

(30) Foreign Application Priority Data

Nov. 28, 2007  (TW) ................................ 96145219 A

(51) Int. Cl.
*H01S 5/00*  (2006.01)
(52) U.S. Cl. ................ 372/50.11; 372/43.01; 372/96
(58) Field of Classification Search ............. 372/50.11
See application file for complete search history.

(56) References Cited

U.S. PATENT DOCUMENTS

| | | | | |
|---|---|---|---|---|
| 4,742,378 A | * | 5/1988 | Ito et al. ............. | 372/46.01 |
| 5,663,979 A | * | 9/1997 | Marshall ............. | 372/103 |
| 7,589,880 B2 | * | 9/2009 | Kempa et al. ......... | 359/245 |

* cited by examiner

*Primary Examiner* — Jessica T Stultz
*Assistant Examiner* — Xinning Niu
(74) *Attorney, Agent, or Firm* — Muncy, Geissler, Olds & Lowe, PLLC

(57) ABSTRACT

The present invention provides a fabrication method of coaxial line laser diodes and a coaxial lighting optical fiber which disperses and guides uniform emission of light from a coaxial line laser diode. The line coaxial laser diode can be extended at a greater length to generate more spontaneous emission photons which are emitted from an elongated tubular active layer. The active layer has a uniform built-in electric field to distribute uniform current therein to get higher quantum efficiency. The length of the coaxial laser diode can be increased through a VLSED method. A longer laser ingot can be produced and cut to a large number of coaxial laser diodes. This method can reduce the waste of cutting in the wafer process and get larger lighting areas. Both the coaxial line laser diode and the coaxial lighting optical fiber can be coupled to form a high efficiency white-emitting luminescence device.

3 Claims, 17 Drawing Sheets

LIGHTING DEVICE EQUIPPED WITH COAXIAL LINE LASER DIODES AND FABRICATION METHOD THEREOF

FIELD OF THE INVENTION

The present invention relates to a coaxial line laser diode and particularly to a solid lighting device equipped with high intensity laser diodes and a fabrication method thereof.

BACKGROUND OF THE INVENTION

Solid state semiconductor light source has a smaller size, and higher efficiency and greater adaptability, thus has become a very important energy saving product in applications of optical communication, industrial sensors and white-emitting luminescence. The conventional light-emitting diode (LED) generates spontaneous emission through recombination of electrons and holes. The light being generated is a random light with diverse phases, polarities and radiating directions, hence also called incoherent light (referring to FIG. 1A). On the other hand, semiconductor laser light is generated through repetitive optical amplification according to the principle of laser action that has spontaneous emission taking place in a cavity resonator between two mirrors at two ends to generate standing wave oscillation and produce stimulated emission. The light being generated is coherent light with the same phase, polarity and radiation direction (referring to FIG. 1B). FIG. 2 illustrates a Fabry-Perot laser made of LEDs in a heterogeneous structure. It has an anode 200, a p-type AlGaAs semiconductor 201, a n-type AlGaAs semiconductor 202, a confinement layer (also called cladding layer) 206 which is an active layer made of a p-type GaAs semiconductor interposed between the semiconductors 201 and 202. Carriers are injected and confined in the active action layer to facilitate light generation. It also has an n$^+$-type GaAs substrate 203 and a p$^+$-type GaAs 204 and a cathode 205. Because of the repetitive optical amplification of the laser action that generates light in the same direction, light extraction efficiency ($\eta_{ex}$) is higher. The commonly used wall-plug efficiency ($\eta_{wp}$) of the LED is the ratio of optical output power and input power of the LED. Equation $\eta_{wp}=\eta_{int}\times\eta_{ex}\times\eta_v$ is applicable here, where $\eta_v$ is voltage efficiency. $\eta_v=h\upsilon/qV$. $\eta_{int}$ is the internal quantum efficiency which is the ratio of the number of photons and the number of coupled electrons and holes. Another equation $\eta_{int}=(_{led}P_{opt}/h\upsilon)/(I/q)$ can be applied, where h is Plank's constant, $\upsilon$ is photon frequency, q is electric charge, V is voltage, I is current, and $_{led}P_{opt}$ is optical output power of the LED.

The following equation also can be derived:

$$\eta_{wp} = \eta_{int} \times \eta_{ex} \times \eta_v \qquad (1)$$
$$= (_{led}P_{opt}/h\upsilon)/(I/q) \times \eta_{ex} \times (h\upsilon/qV)$$
$$= (_{led}P_{opt} \times \eta_{ex})/IV$$

Hence for a given input power IV, to get a higher wall-plug efficiency $\eta_{wp}$, the internal quantum efficiency has to increase to achieve a higher optical output power $_{led}P_{opt}$ and higher light extraction efficiency $\eta_{ex}$.

The relationship of lighting power generated by the conventional solid state semiconductor and current (namely P-I characteristics) is shown in FIG. 3 which illustrates characteristic comparisons of an LED in a spontaneous emission zone and a laser diode in stimulated emission. For an LED in a special structure such as DFB laser or Fabry-Perot laser, when the forward-biased current reaches the starting current, additional injected current is totally transformed to laser light emitting from the semiconductor. Assumed that a unit current 1iu is injected into the spontaneous emission zone before the laser action taking place, and optical output power is 1pu for comparison, injecting two times of current 2iu in the laser action zone can generate 16pu of optical output power, thus an extra power about 15pu can be generated. Based on the equation (2) set forth above, the following equation also can be derived:

$$I-I_{th}=eUB(N_e-N_o)N_p=(eU/\tau_p)N_p \qquad (2)$$

where I is the injected current after started, $I_{th}$ is the starting current, U is the volume of the active action layer, B is the vanishing probability of the injected electrons resulting in the stimulated emission, e is the charge amount of the electrons, $N_e$ is carrier (electrons) density in the active action layer of the laser diode after DC power is injected, $N_o$ is the minimum starting carrier (electrons) density, $N_p$ is the photon density of the stimulated emission, and $\tau_p$ is the average lifetime of the photons that can be indicated according to the equation below:

$$\tau_p=(n/c)(\alpha+L^{-1}\ln R^{-1}) \qquad (3)$$

where n is the refractive index of the active action layer, c is light speed, $\alpha$ is the value of light absorption coefficient per unit length in material of the active layer, L is the length of the resonate cavity, and R is the reflectivity of the two end surfaces.

Referring to equation (2), when the current is greater than the starting current $I_{th}$, additional injected current is totally transformed to stimulated emission, The lighting power is shown in FIG. 3 by the slope of the stimulated emission zone, and is proportional to $(I-I_{th})$. The equation (2) can be differentiated to derive another equation as follow:

$$dN_p/dI=\tau_p/eU \qquad (4)$$

It shows the slope of the photon density of the stimulated emission generated by injection of current in the laser diode. It indicates that the longer the average life span $\tau_p$ of the stimulated emission photon, the greater the slope becomes. The equation (3) also shows that the smaller the absorption $\alpha$ of the active action layer, and the longer the resonate cavity, the greater the slope becomes. Namely, a greater optical output can be generated.

Light emission efficiency of the laser diode can be indicated in four approaches: internal efficiency ($\eta_i$), differential quantum efficiency ($\eta_d$), total device efficiency ($\eta_t$) and laser efficiency ($\eta_l$). The laser efficiency $\eta_l$ is defined the same as the LED power efficiency $\eta_{wp}$, but with different unit indications, and are different from light emission efficiency of the LED.

The internal efficiency is the percentage of the number of photons Np in stimulated emission generated by a forward-biased voltage against the number of injected electrons Ne, namely:

$$\eta_i=(Np/Ne)\times 100\% \qquad (5)$$

The differential quantum efficiency is the percentage of the number of photons in stimulated emission against the number of injected electrons in a unit time, namely:

$$\eta_d = (d(_{ld}P_{opt}/h\upsilon))/d(I/e) \quad (6)$$

$$= (d_{ld}P_{opt}/dI)/Eg$$

where Eg is the minimum energy gap (Eg=Ec−Ev) of the emission wave length of a selected light-emitting material, $_{ld}P_{opt}$ is the lighting power of the laser diode as shown in FIG. 3, the slope is:

$$\tan \alpha = d_{ld}P_{opt}/dI = \eta_d \times Eg \quad (7)$$

The total device efficiency is defined as the ratio of the number of emitting photons against the number of injected electrons, and can be indicated by equation (8) below:

$$\eta_t = (_{ld}P_{opt}/h\upsilon)/(I/e) \quad (8)$$

$$= {_{ld}P_{opt}}/IEg$$

$$= \eta_d(1-(I_{th}/I))$$

The laser efficiency is defined as the ratio of light emission power against the input electric power, namely:

$$\eta_l = {_{ld}P_{opt}}/IV = \eta_t \times (Eg/V) \quad (9)$$

where V is the voltage applied to the laser diode. The laser efficiency is indicated the same as the power efficiency of the LED. Although the wall-plug efficiency of the LED $\eta_{wp}$ ($\eta_{wp} = (_{led}P_{opt} \times \eta_{ex})/IV$) and the laser efficiency $\eta_l$ ($\eta_l = {_{ld}P_{opt}}/IV$) of the laser diode are derived based on the ratio of the optical output power and the input power, the slope of the laser diode is much greater than the LED. The main difference is that: the extraction efficiency of the spontaneous emission $\eta_{ex}$ is lower. As a comparison, when the current in the resonate cavity is greater than the starting current $I_{th}$, the additional current (I−$I_{th}$) (namely the extra carriers being injected) resulting from the stimulated emission is totally transformed to the stimulated emission. Hence the slope increases significantly. Moreover, according to equation (2), increasing U also increases the volume of the active action layer, and more electrons are injected to boost output power. As a result, maximum optical energy can be obtained or energy saving effect can be achieved. Thus getting a higher extraction efficiency through standing wave oscillation of the resonate cavity and increasing the volume of the active action layer are a preferable choice of the light emitting structure. However, transforming the laser light of maximum power efficiency to high photoelectric energy for illuminating purpose still has drawbacks, notably:

1. The lighting spot is concentrated and cannot illuminate a greater area. And concentration of energy also damages the projecting object, such as hurting retina or creating the risk of uncontrollable burning.

2. The conventional laser chips are made by forming epitaxy on a semiconductor wafer, then performing cutting. The laser chips contain an active action layer capable of emitting light, but being formed at a limited volume. Hence using the initial optical energy of the limited spontaneous emission can trigger only limited amplification in the photoelectric transformation of the laser amplification already done. Moreover, the cutting operation to form the laser crystals has to be done in the expensive integrated circuit manufacturing process and manufacturing processes of plane deposition or epitaxy forming on the expensive wafer. As a result, the production cost is higher. All this makes mass production to expand applications difficulty.

If the aforesaid drawbacks can be overcome, the high efficiency solid state laser can be adopted for lighting use. Moreover, the problems of the low external quantum efficiency of the spontaneous emission of the solid state lighting equipment and the loss caused by internal thermal absorption occurred to the conventional white-emitting LED also can be resolved. Then using the semiconductor for white-emitting luminescence can be truly realized.

SUMMARY OF THE INVENTION

In view of lighting is required for safe movement and working of people indoors, and the conventional electric luminescence devices consume a great amount of energy resources, improvement is needed. The conventional LED for illumination purpose has the disadvantages of a lower extraction efficiency and heat generation resulting from recombination of photons of scattering light that are not being extracted, thus is not desirable for long period illumination and cannot meet energy saving purpose. But using laser of high extraction efficiency for illumination purpose is expensive and cannot be widely adopted. Moreover, the laser lighting fixture has greater homogenous output that cannot be evenly distributed to provide uniform white-emitting illumination. All these issues remain to be overcome.

The present invention adopts the principle of coaxial semiconductor light source structure and coaxial light guide optical fiber disclosed by Applicant in a previous patent application at (U.S. Ser. No. 12/001,131) patent application No. 095146963 (Taiwan) entitled "THE COAXIAL LIGHT-GUIDE SYSTEM CONSISTING OF COAXIAL LIGHT-GUIDE FIBER BASING ITS REFRACTIVE INDEX PROFILES ON RADII AND WITH ITS COAXIAL BOTH SEMICONDUCTOR LIGHT SOURCES AND SEMICONDUCTOR DETECTORS". The invention further provides a coaxial line laser diode coupling with a coaxial lighting optical fiber to solve the aforesaid problems. More details are elaborated as follow:

1. The coaxial semiconductor light source structure can be a coaxial line laser diode fabricated by producing a coaxial laser ingot at an extended length and cutting the ingot at two sides to form sections, thus can save material in a simpler fabrication process and reduce costs. The coaxial semiconductor light source has an anode and a cathode that are coaxial and equally spaced inwards and outwards from the same axis to supply electric power. A lighting annular semiconductor layer is located coaxially in the middle to become the coaxial semiconductor light source to supply electric power. It includes a coaxial LED and a coaxial laser diode. FIG. 4 illustrates an example of a coaxial semiconductor laser functioning as a light source with a wavelength used in communication. It depicts a coaxial DFB (Distributed Feedback Laser Diode) heterojunction laser partly cut away to show the coaxial structure of a coaxial annular semiconductor layer. A novel coaxial laser is formed based on the conventional plane DFB heterojunction laser. In this example, the coaxial laser diode is fabricated from a wafer substrate. The coaxial semiconductor laser has annular semiconductor layers formed in homojunction or isotype heterojunction, or unisotype heterojunction. A spontaneous emission can be formed to generate laser action with stimulated emission. Such a laser emitting action adopts the feedback function of Bragg's grating as the conventional technique does to form various types of DFB laser or distributed Bragg reflector (DBR) laser.

The coaxial semiconductor laser light source used as an example in following discussion is based on the coaxial DFB heterojunction laser. It includes a positive power supply conductor core electrode 407 and a negative power supply conductor formed in a coaxial outer annular power supply electrode 408, and a plurality of annular coaxial semiconductor layers interposed between them that are commonly formed on an n-type InP substrate 409. The annular layers include an annular active action layer InGaAsP 404, an annular semiconductor layer 405 such as a p-type InGaAsP layer, a reflective layer 406 and a Bragg's distributed feedback grating 403. The Bragg's distributed feedback grating 403 consists of an annular n-type InP semiconductor layer 401 and an annular n-type InGaAsP semiconductor layer 402. The Bragg's grating has a feedback wavelength $\lambda_B$ which can be derived according the equation as follow:

$$\lambda_B = 2n\Lambda/m \tag{10}$$

where n is the refractive index of the semiconductor material, $\Lambda$ is the period length of the Bragg's grating, m is the order of diffraction with a value of 1 or 2 (usually 1). The light emission wavelength $\lambda_B$ is chosen first. In the conventional fabrication technique of plane deposition on a wafer substrate, forming the thickness $\Lambda$ at the desired period length for the Bragg's grating involves a lot of repetitive processes and is costly. Fabrication of a surface emitting laser includes forming a Bragg's grating on a n-type InP annular semiconductor layer 401, then forming a n-type InGaAsP annular semiconductor layer for a complementary inner Bragg's grating 402 by depositing or growing epitaxy to become a Bragg DFB laser. The laser thus formed can serve as the light source of optical communication. While it has higher emission efficiency, the fabrication cost also is higher, thus is not a desirable lighting source for general or low cost lighting. FIG. 5 illustrates another conventional technique which adopts a light source of a Vertical Cavity Surface Emitting Laser (VCSEL) or called Resonate cavity light-emitting diodes (RCLEDs). It includes a lower Bragg reflective mirror 501, an action layer 502, a buffer layer 503, an upper Bragg reflective mirror 505 and an annular electrode 506. It is a laser with a DBR (Distributed Bragg Reflector) laser. Fabrication involves forming an upper layer and a lower layer on the DBR at a desired thickness by repetitive deposition. The VCSEL laser thus formed has a low production yield and a higher cost. Moreover, the deposition layers on the upper and lower sides of the Bragg reflective mirror DBR grating are very fine. It also has epitaxy growth layers 501 and 505. The epitaxy layer has a higher refractive index at $\lambda/4$ and a lower refractive index at $\lambda/4$ to generate Bragg's grating function. When the device is forward biased, passing through the very fine layers incurs a voltage drop, especially on the heterojunction. Nonconsecutive phenomenon of broken gap occurs and current flow could be hindered. The unstable current makes power boosting difficult. As a result, VCSEL laser cannot provide a higher power output. Thus the higher power output laser generally is made of an edge emitting diode as the DFB laser diode shown in FIG. 6.

The edge emitting laser or surface emitting laser produced by plane deposition are formed by deposition on a conventional semiconductor wafer, then is cut at four sides and finished by grinding. The surface emitting coaxial laser proposed by the Applicant mentioned above also adopts such a process. As the wafer is formed by cutting off an upper side and a lower side of a pure ingot which is grown at a very low speed and grinding, its production yield is lower and the cost is higher. It cannot meet the great demand of integrated circuits in the semiconductor industry and photoelectric illumination and solar cell applications. Material shortage frequently occurs. It seriously affects development of the photoelectric technology and hinders energy saving endeavors of mankind. In addition, a laser product requires cutting and grinding on six surfaces that result in a huge waste of material. All this requires a new fabrication technique to make improvements needed.

In order to maintain the advantages of high quantum efficiency of the coaxial laser diode and overcome the high cost resulting from wafer deposition and material loss by cutting and grinding six surfaces, the Applicant further proposes a technique disclosed in Taiwan, patent application No. 096116961 entitled: "THE SOLID STATE LIGHTING DEVICE STRUCTED BY THE COAXIAL LINE LIGHT EMITTING DIODES" which provides a fabrication method to produce a coaxial semiconductor light source by adopting a deposition process used in forming the coaxial line semiconductor. It includes extending the core electrode at a greater length and producing a laser ingot by depositing epitaxy after a Bragg's grating has been made. The coaxial line laser of the present invention can be formed by cutting off merely the upper and lower sections at a minimum time and a minimum cutting loss. The fabrication method of deposition to form the line coaxial semiconductor (as shown in FIG. 7A and explain in embodiment 1, where RF power generators 11 subrods 606 as a cathode, RF annular anode coil 607, an annular plasma 608, coaxial annular semiconductor layer 609, round tubular dielectric duct 1) includes disposing an core conductor wire or naked metal wire made from a pre-plating semiconductor material in a round tubular dielectric duct 1 with a controllable vacuum (or a metal core conductor engraved in advance with a period length $\Lambda$ of Bragg's grating or a depositing layer) to serve as the cathode 606, and an anode formed by a high voltage annular coil 607 and coupled on the dielectric duct 1 and movable up and down. Thus a DC or radio frequency (RF) high voltage plasma stimulating device can be formed. On an inner side and an outer side of the dielectric duct between the two coaxial electrodes DC or RF discharge plasma is supplied to provide energy for discharged ions produced by a chemical reactive compound passing through the duct. Then the reactive ions are deposited or epitaxy is formed on the surface of the core electrode. When the annular anode is moved once between two ends outside the dielectric duct, a depositing layer 609 is formed on the surface of the cathode at the core of the dielectric duct through a chemical vaporizing material, and a thicker film can be deposited and grown to form the coaxial annular semiconductor layer 609 as shown in FIG. 7A. The thickness of the depositing epitaxy can be controlled by altering the moving speed, the flow amount or flow rate of the reactive material, temperature and pressure or other fabrication factors. Different depositions can be formed by repetitive process according to the thickness and types of the selected semiconductor on each layer. Therefore, all the coaxial annular semiconductors or conductor layer in the line coaxial semiconductor can be formed. And the light source base rod of an elongate coaxial line semiconductor can be produced. It can be simply called a laser ingot. Thereafter the laser ingot is removed from the duct and cut in sections and ground at two ends to serve as the conductive coaxial line laser diode. Referring to FIG. 8A, there are a coaxial core electrode 801 and a $P^+$-type InP 802 to form a base rod of a Bragg's grating distributed feedback layer, a P-type annular confinement layer 803 made from $Al_xGa_{1-x}$As, a P-type active action layer 804 made from GaAs, an N-type confinement layer 805 made from $Al_xGa_{1-x}$As, an outer annular power supply electrode 806, an insulation reflective layer 807, and a protective reflector layer 808. FIG. 8B depicts the fabrication process of the coaxial line laser diode. It includes: step 809 for fabricating in advance a Bragg's grating base rod before deposition is processed, step 810 for finishing deposition to produce a laser ingot, step 811 for cutting the coaxial line laser ingot into sections, and step 812 for finishing package of power supply bases.

The process for fabricating the laser ingot of the coaxial line semiconductor laser previous discussed further includes fabricating in advance the Bragg's grating by deposition, or removing the Bragg's grating during the fabrication process and disposing into the duct again to continue the deposition process. As the emitting opening of the coaxial laser is not blocked by electrodes, only the coaxial laser can be made with the active layer of a longer and larger size to generate laser light. As the coaxial line laser made from one laser ingot needs cutting only on the upper side and lower side, waste resulting from cutting is reduced significantly. Compared with the conventional laser which has to be cut on six sides, the invention can greatly reduce waste of the expensive semiconductor material. Hence the cost is reduced significantly and wider applications are possible. The invention also adopts a VLSED method, namely "Vertical, Large-number, Synchronizing and Line-Shape Epitaxial Deposition", disclosed by the Applicant in Taiwan, patent application No. 096116961 entitled "THE SOLID STATE LIGHTING DEVICE STRUCTED BY THE COAXIAL LINE LIGHT EMITTING DIODES" as shown in FIG. 7B. Adopted such a method mass production of the coaxial line laser ingots is possible. It provides a simplified fabrication process to produce coaxial lasers of a greater light intensity through a Bragg's grating process of a selected wavelength. As shown in embodiment 1 discussed later, it provides an optimal technique to solve the aforesaid problems.

2. Coaxial lighting optical fibers also can be used to enable the coaxial laser to achieve uniform light generation and illumination. A coaxial light-guide optical fiber has refractive index profile based on the radius, and is different from the conventional optical fiber with the refractive index profile based on the diameter. The coaxial outer-cladding and axial inter-cladding have the same refractive index. The refractive index for light guide is shifted from the center core to the entire radii of the optical fiber. Light is transmitted between the axial inter-cladding and the coaxial outer-cladding rather than through the axial area. As the axial inter-cladding and the outer-cladding have the same refractive index, light transmission is shifted to a bend type annular ring formed in the middle of the radius rather than through the core as the conventional optical fiber does, as shown in FIGS. 9A, 9B and 9C. FIG. 9A depicts light transmission through the annular core in a coaxial single mode. FIG. 9B depicts light transmission in a self-focusing fashion through an annular core of the optical fiber with a graded index in a coaxial multi-mode. FIG. 9C depicts light transmission through an annular core of the optical fiber with a step index in a coaxial multi-mode. All the above approaches adopt the coaxial light-guide optical fiber to allow light to be injected into the optical fiber and transmitted to a long distance for communication purpose, because the refractive index of annual core is higher than the outer-cladding and axial inter-cladding.

In order to achieve uniform emission of a high intensity laser at a short distance for illumination purpose, the invention further provides a novel coaxial lighting optical fiber with the refractive index distributed as shown in FIGS. 10A and 10B. FIG. 10A illustrates the structure of a multi-mode coaxial lighting optical fiber with a step index. It has an annular core 1001 with a lower refractive index $n_1$, an outer-cladding 1002 with another refractive index $_o n_2$, an axial cladding 1003 or called axial inter-cladding with yet another refractive index $_i n_2$. The refractive indexes of the inter-cladding and the outer-cladding are the same, namely $_i n_2 =_o n_2$. As the annular core 1001 has a lower refractive index, a fully coupling laser light injected into the annular core 1001 is directed outside the optical fiber as indicated by the light propagation paths in the drawings. Furthermore, the inter-cladding 1003 is surrounded by the annular core 1001 of the lower refractive index and has a higher refractive index thereof like the conventional light-guide optical fiber. Light entered the axial cladding is totally reflected without evenly dispersing outside the optical fiber. The coaxial lighting optical fiber has a tail end cut to form a reflective surface 1004 to eject the light propagating through the inter-cladding. As shown in the drawing, the reflective surface at the tail end may be ground to form various angles or shapes such as conical according to a required emitting direction to facilitate light dispersing. FIG. 10B depicts the structure of a single-mode coaxial lighting optical fiber with a step index.

The invention adopts the annular core of a higher refractive index from the coaxial light-guide optical fiber, but alters the annular core to a lower refractive index to disperse light. The laser light ejected from the annular active action layer of the coaxial laser diode can fully match the annular core of the coaxial lighting optical fiber to form a natural coupling. The annular core is doped with boron or fluorine by deposition to lower the refractive index. Its refractive index $n_1$ is lower than the refractive indexes $_i n_2$ and $_o n_2$ of the inter-cladding and outer-cladding. Thus the intensified laser light entered and propagated through the annular core can be fully ejected outside the optical fiber to evenly disperse to meet illumination purpose.

In short, the invention provides two approaches to resolve the aforesaid problems occurred to the conventional techniques, and can reap benefits as follow:

1. The coaxial lighting optical fiber provided by the invention can evenly distribute intensified laser to illuminate a greater area. According to rules stated in American Lighting Association CIE 1931, three color lights of red, green and blue are selected to be output by three-colored coaxial lasers. Each color light is injected in a dedicated coaxial lighting optical fiber and fully blended to form white light through a desired arrangement and distribution of dispersed refractive index profile to be evenly ejected. Aside from the distribution of the dispersed refractive index profile to guide internal wave propagation, the three coaxial lighting optical fibers may also be slightly bending and twisted to form a blended white-emitting light source or LCD backlight source.

2. The invention also provides a method to fabricate the coaxial line laser diode by deposition through the coaxial line laser diode and coaxial line semiconductor to resolve the problems of limited light emission caused by size constraint of laser chips and higher cost resulting from material waste in the cutting process. The fabrication method for producing coaxial line laser by deposition that adopts the coaxial line semiconductor structure is used to fabricate the laser ingot. Cutting the laser ingot does not produce a lot of material loss, hence can significantly reduce the cost. Moreover, the coaxial laser ingot can be mass produced by adopting a vertical synchronous technique. Not only the cost is lower, multi and synchronous deposition process also can be accelerated. More added value can be realized through the synchronization. In the event that generating intensified stimulated emission optical energy is needed, a base diode lighting structure capable of high efficiently generating a great amount of spontaneous emission optical energy must be adopted. The invention provides the longest active layer to increase the photons at the initial spontaneous emission, and a photoelectric transformation can be performed through laser amplification to boost power output more efficiently.

As the LED is a semiconductor device to transform electric energy to optical energy, it needs current injection. How to make the injected current to evenly drift and disperse in the entire LED is important, especially to evenly enter the lighting active layer. The lighting current is provided through the anode of the coaxial core and drifts radially across the radius and disperses to the outer annular conductor in an equally spaced manner. Driven by an electric field generated by the voltages from two power supply coaxial electrodes, pairs of electrons and holes on the annular lighting active layer can generate spontaneous emission due to various lighting mechanisms (such as hoping, exciting or the like) to be emitted in all directions. As the electrons and holes provided by the two coaxial power supply electrodes flow to the annular lighting layer interposed between them at the shortest traveling distance coincided with the electric field polarized direction of the radius, namely the carriers move in the drift direction in the maximum radial electric field to form a maximum injection current. The invention has a lengthened axial electrode in the center with the coaxial semiconductor layers formed at the same thickness, and the electrons or holes travel along the radius at the shortest path to evenly pass over a PN built-in electric barrier, and drift and disperse respectively to the outer annular electrode and core electrode, and are coupled in the lighting layer after having passed through the potential barrier to generate light by combination (electrons and holes in an organic semiconductor are transformed in polarons and move in a hopping fashion). Hence light of higher internal quantum efficiency can be generated than the power supply electric field produced by the conventional upper and lower plane layers. The problem of the conventional LED that generates dispersed thermal current due to ineffective recombination can be overcome. The temperature also is lower. Hence the problems incurred by poor cooling of the conventional lighting source can be eliminated.

The foregoing, as well as additional objects, features and advantages of the invention will be more readily apparent from the following detailed description of embodiments, which proceeds with reference to the accompanying drawings.

DETAILED DESCRIPTION OF THE PREFERRED EMBODIMENTS

Embodiment 1

Fabrication Method for Coaxial Line Laser Diodes

Figure 1A:
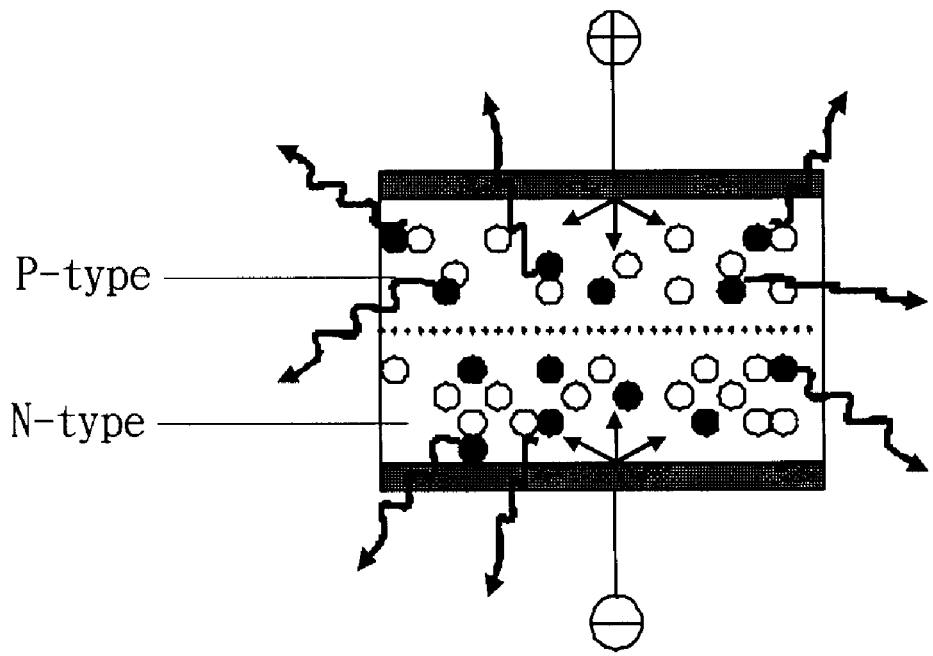
FIG. 1A is a schematic view of a conventional LED in spontaneous emission with incoherent light.
Figure 1B:
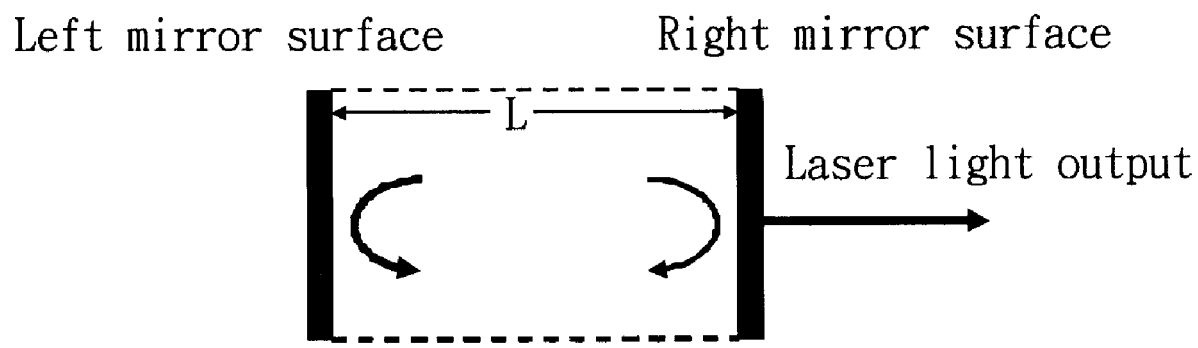
FIG. 1B is a schematic view of a conventional laser diode in coherent stimulated emission.
Figure 2:
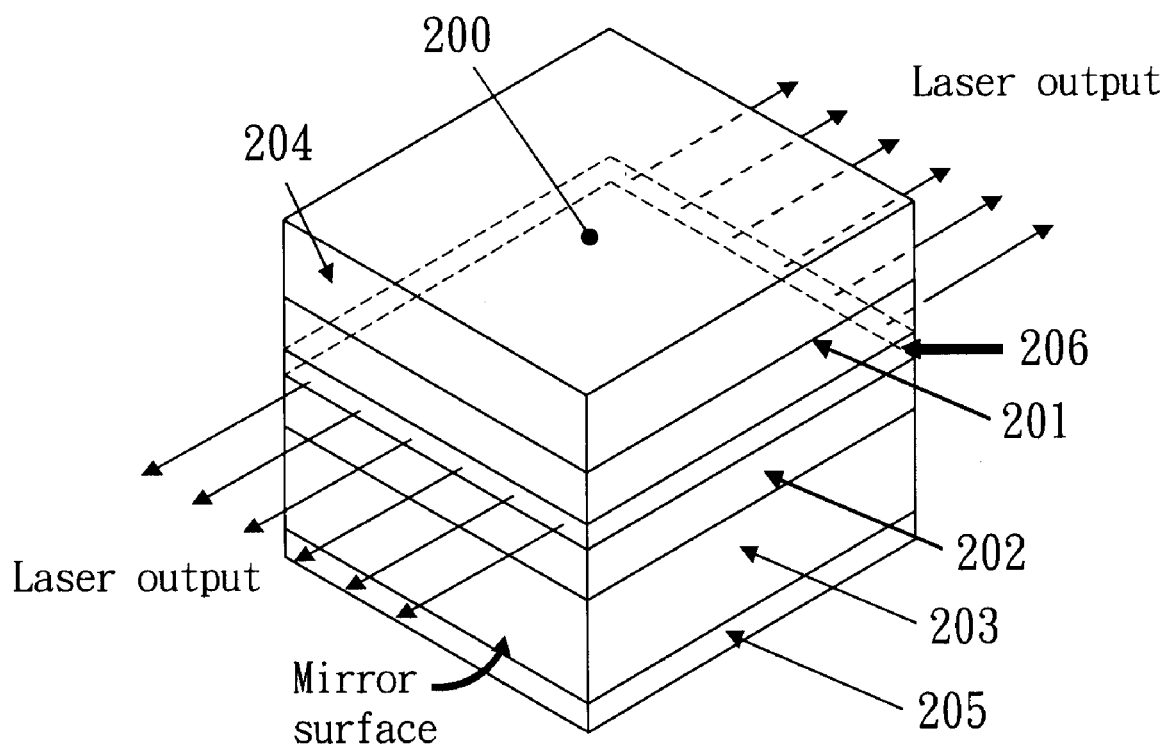
FIG. 2 is a schematic view of a Fabry-Perot laser consisting of LEDs with a dual-heterogeneous structure.
Figure 3:
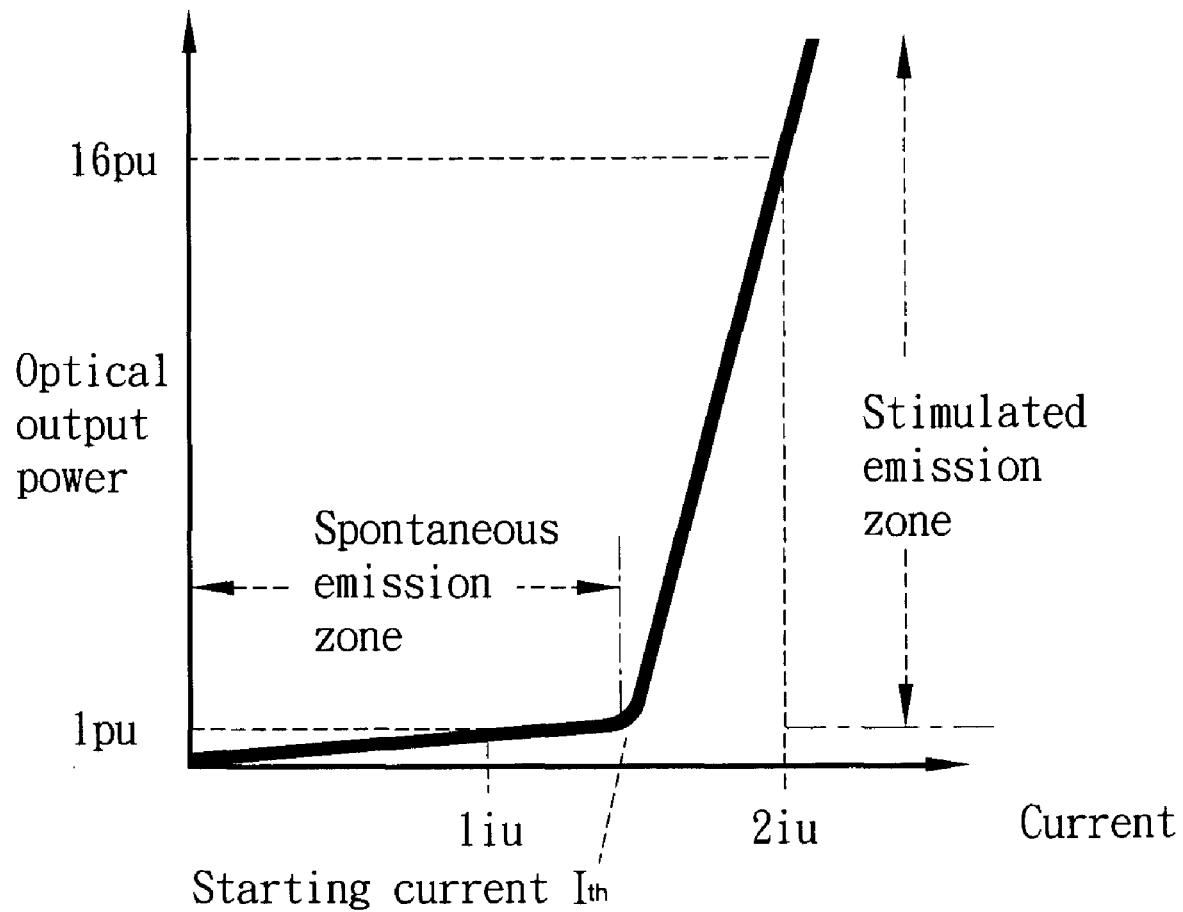
FIG. 3 is a schematic chart showing the relationship of emission power and current of a solid state semiconductor.
Figure 4:
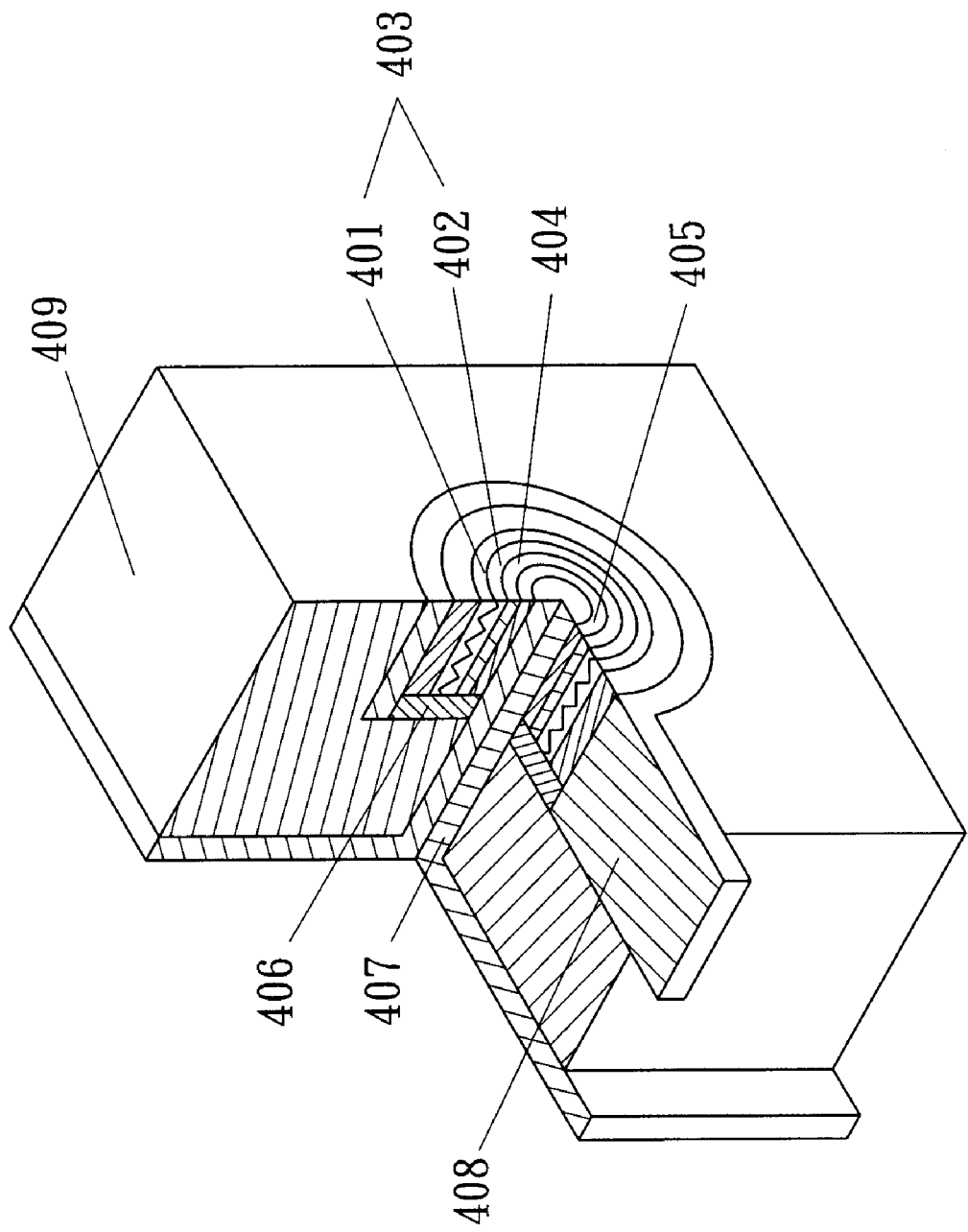
FIG. 4 is a schematic view of the structure of a conventional coaxial semiconductor laser, partly cut away.
Figure 5:
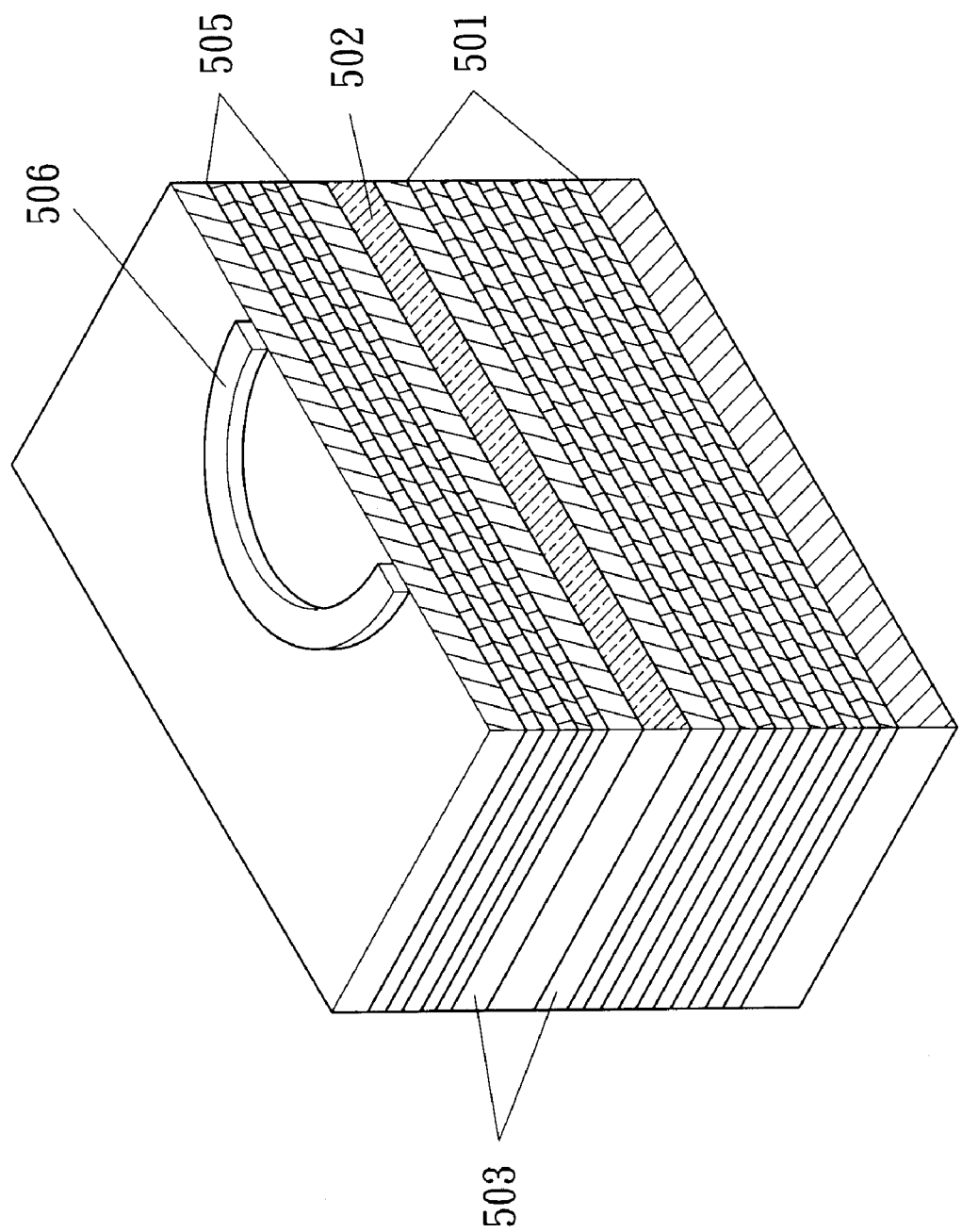
FIG. 5 is a sectional view of a conventional VCSEL.
Figure 6:
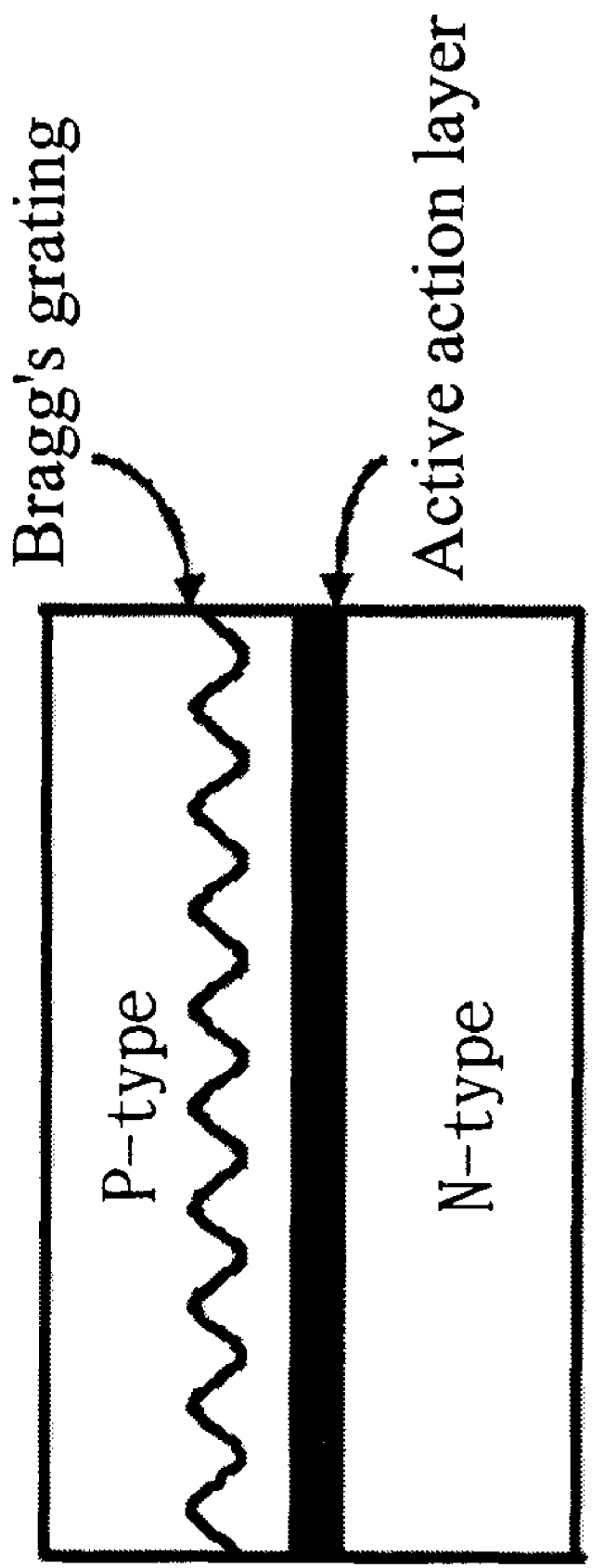
FIG. 6 is a cross section of a conventional DFB edge emission laser diode.
Figure 7A:
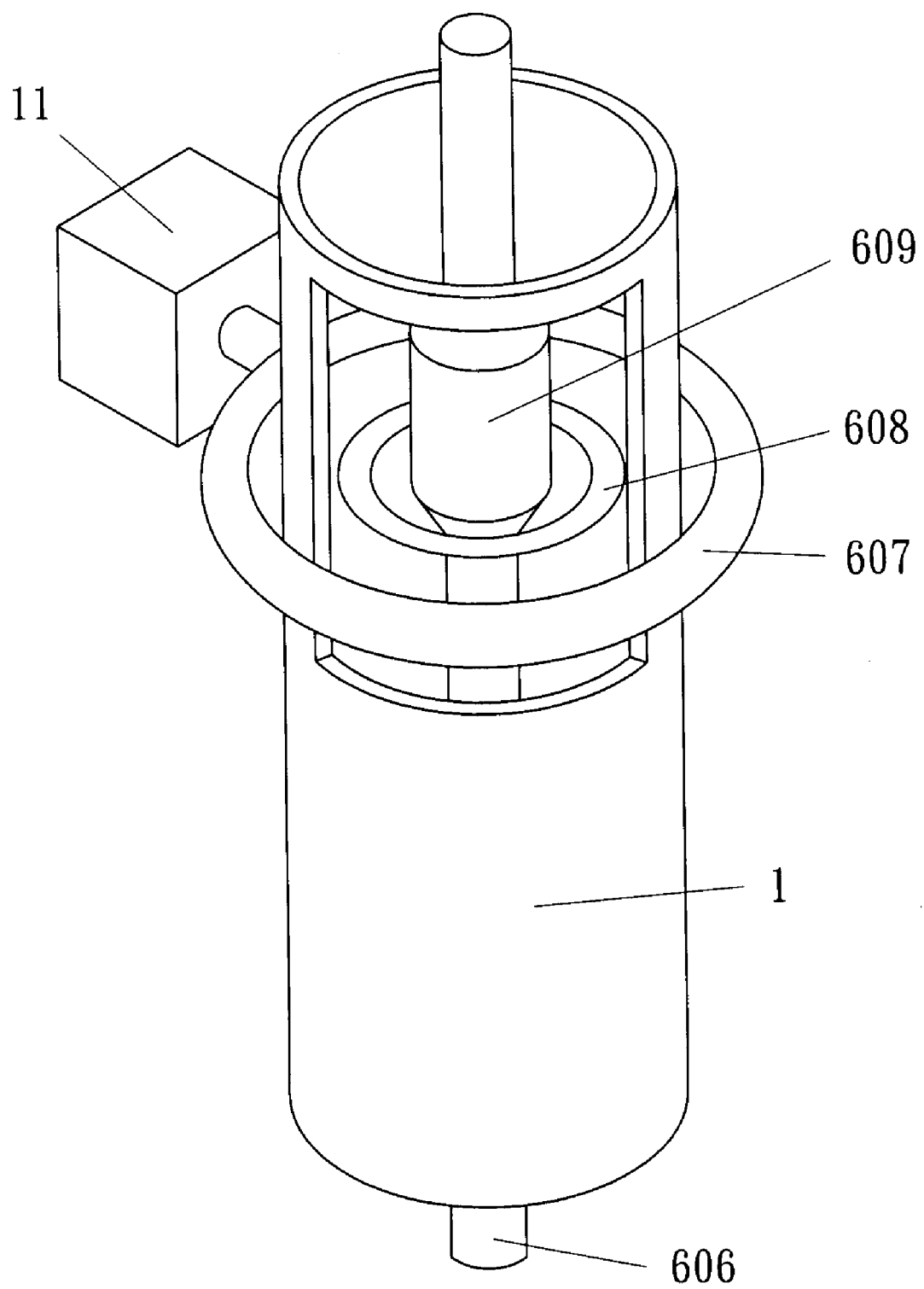
FIG. 7A is a schematic view of starting deposition of epitaxy with plasma on an axial copper electrode core in a quartz duct.
Figure 7B:
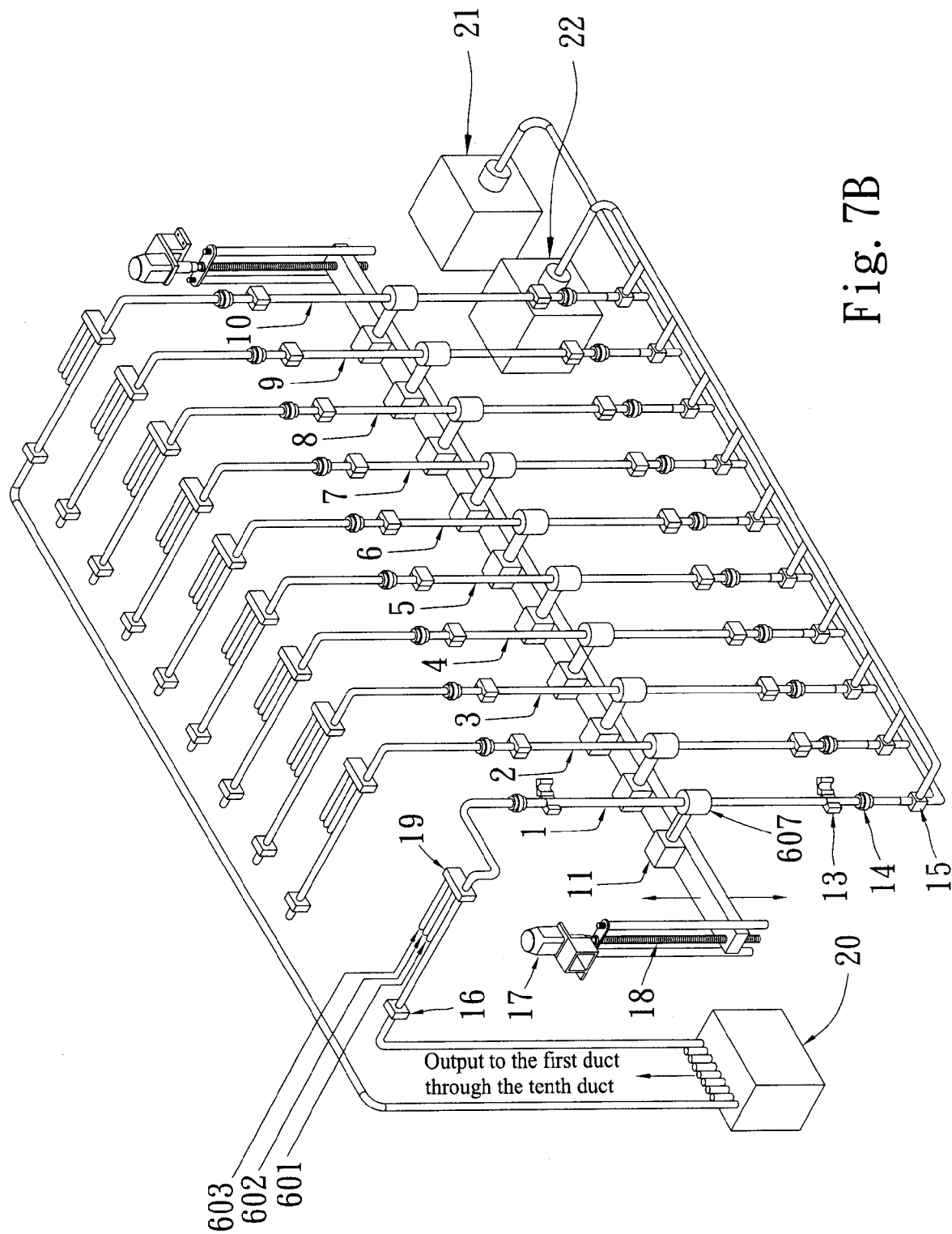
FIG. 7B is a schematic view of a VLSED system for depositing epitaxy to produce coaxial line laser ingots.
Figure 12A:
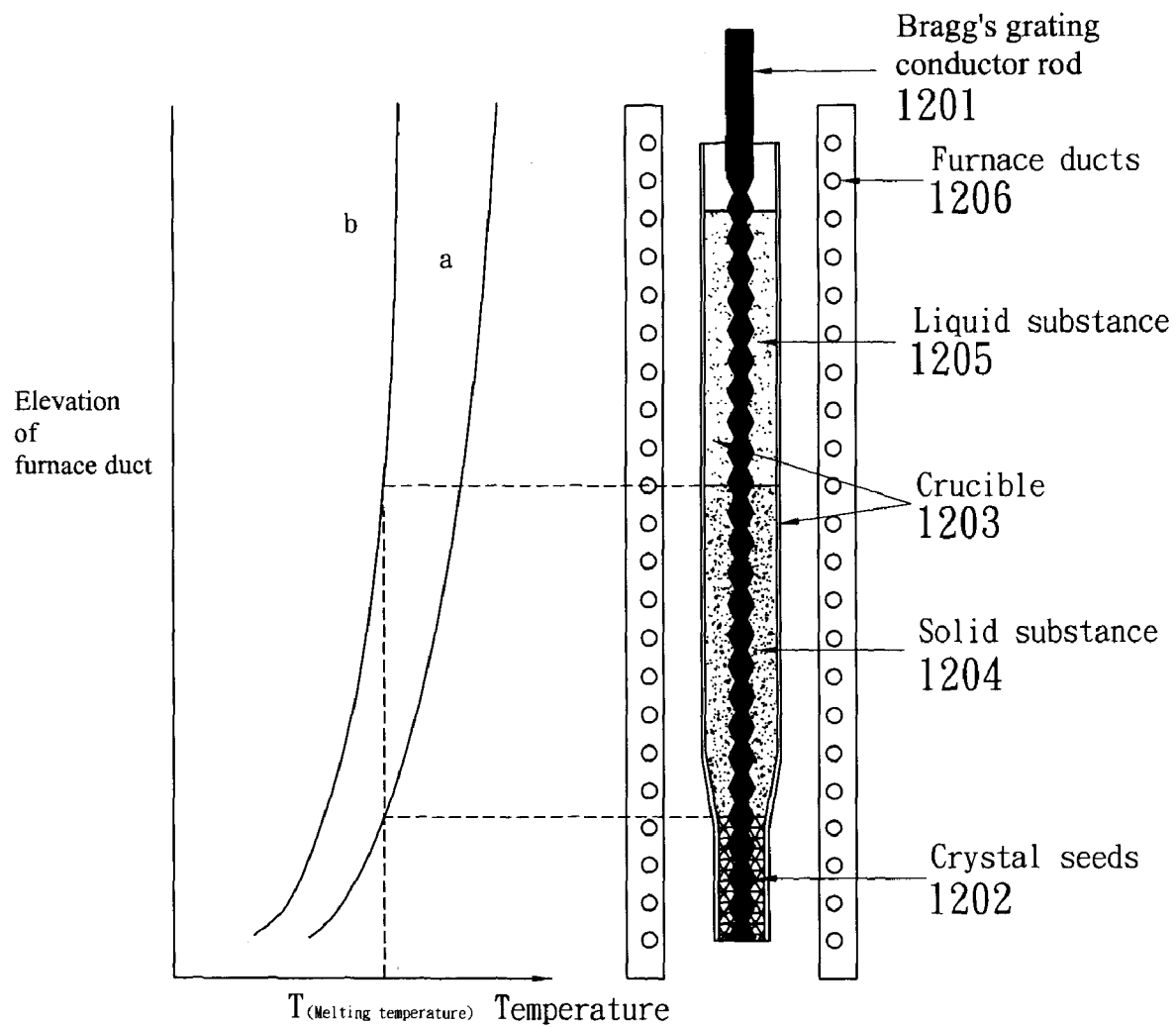
FIG. 12A is a schematic view of fabricating a axial base rod through the VGF growth method with a pre-engraved Bragg's grating base rod.

Refer to FIG. 7B for a VLSED method which stands for vertical large-number synchronizing and line-shape expitaxial deposition. Adopted such a method one set of machine can simultaneously perform deposition to produce ten pieces of coaxial line dual-heterogeneous laser ingots at a length of one meter each; then each laser ingot is cut in sections to form individual coaxial line laser diodes shown in FIG. 8B. At the initial stage of the fabrication process, referring to FIG. 7A and FIG. 7B, ten pieces of subrods 606 at a length of one meter and a diameter of 2 mm are provided and disposed into ten quartz ducts. The subrod 606 is formed through a VGF (Vertical Gradient Freeze) growth method as shown in FIG. 12A that includes the following steps:

1. dispose an a axial metal conductor rod 1201 engraved with Bragg's grating and embedded with an InP crystal seed 1202, and mount the rod at the bottom of a crucible 1203;

2. pour InP polycrystal material into the crucible;

3. heat gradually a furnace tube 1206 to a desired temperature at a varying elevation according to a temperature control curve a;

4. adjust the temperature of the furnace tube according to another temperature control curve b to lower the temperature and allow the interface of solid substance 1204 and liquid substance 1205 to slowly move upwards;

5. grow gradually the InP initial crystal seed in the length direction, the liquid portion gradually vanishes until a whole piece of InP base rod (called subrod) has crystal grown thereon; and 6. remove the InP base rod and dispose it in a VLSED quartz duct to fabricate the coaxial line laser ingot.

Figure 8A:
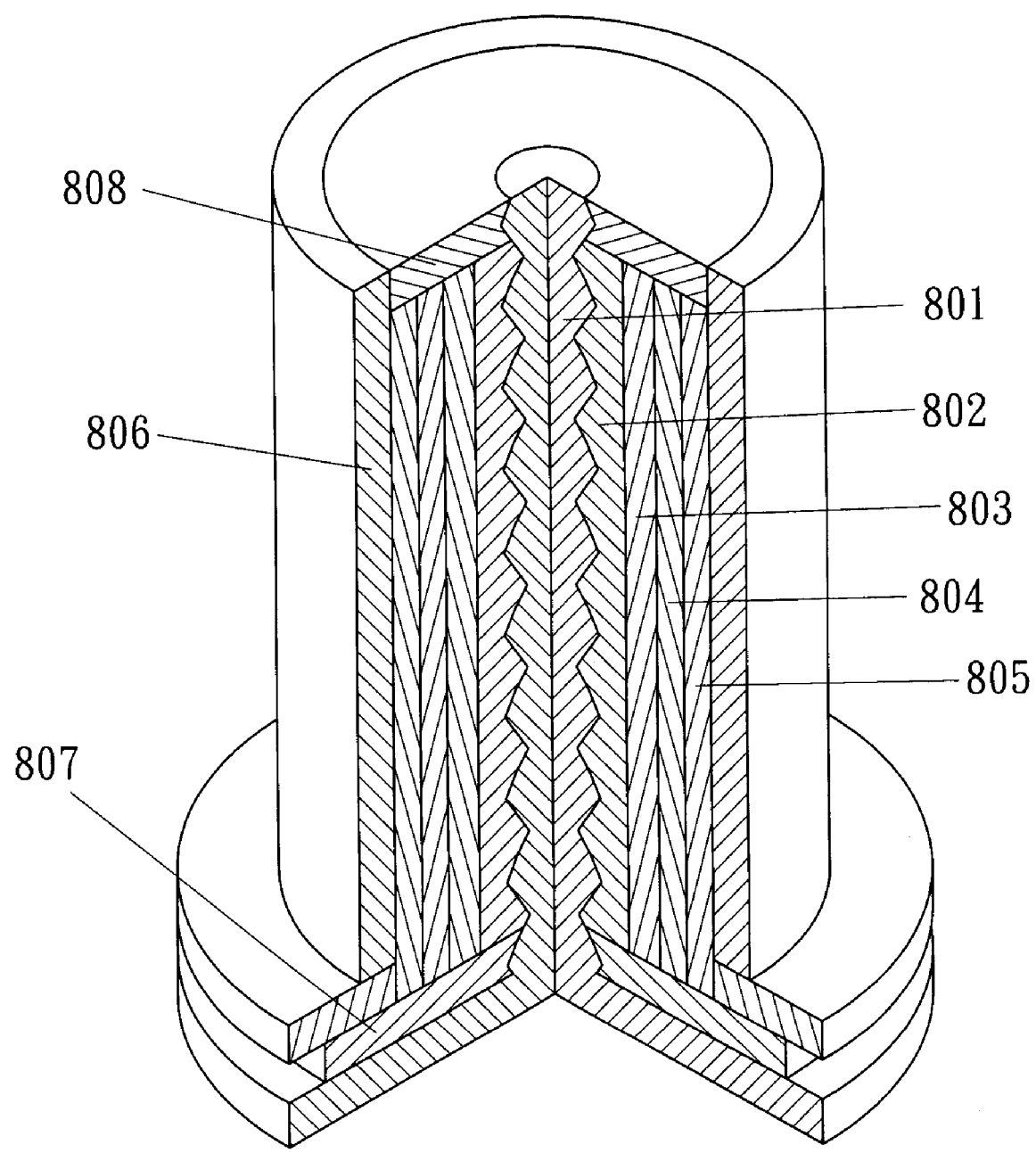
FIG. 8A is a schematic view of the coaxial line laser diode of the invention, partly cut away.
Figure 8B:
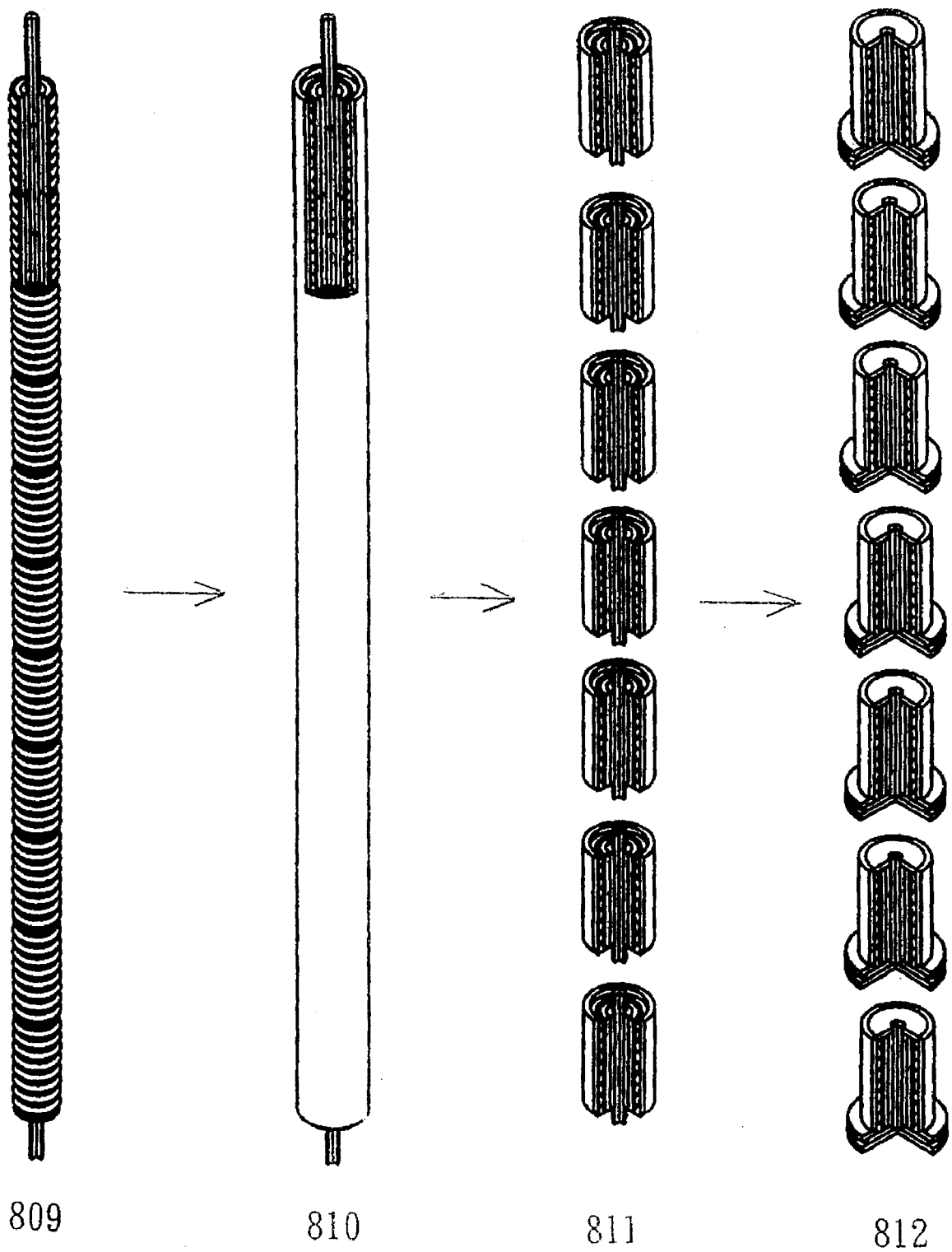
FIG. 8B is a schematic view of the fabrication process for the coaxial line laser diode of the invention.
Figures 9A, 9B, 9C:
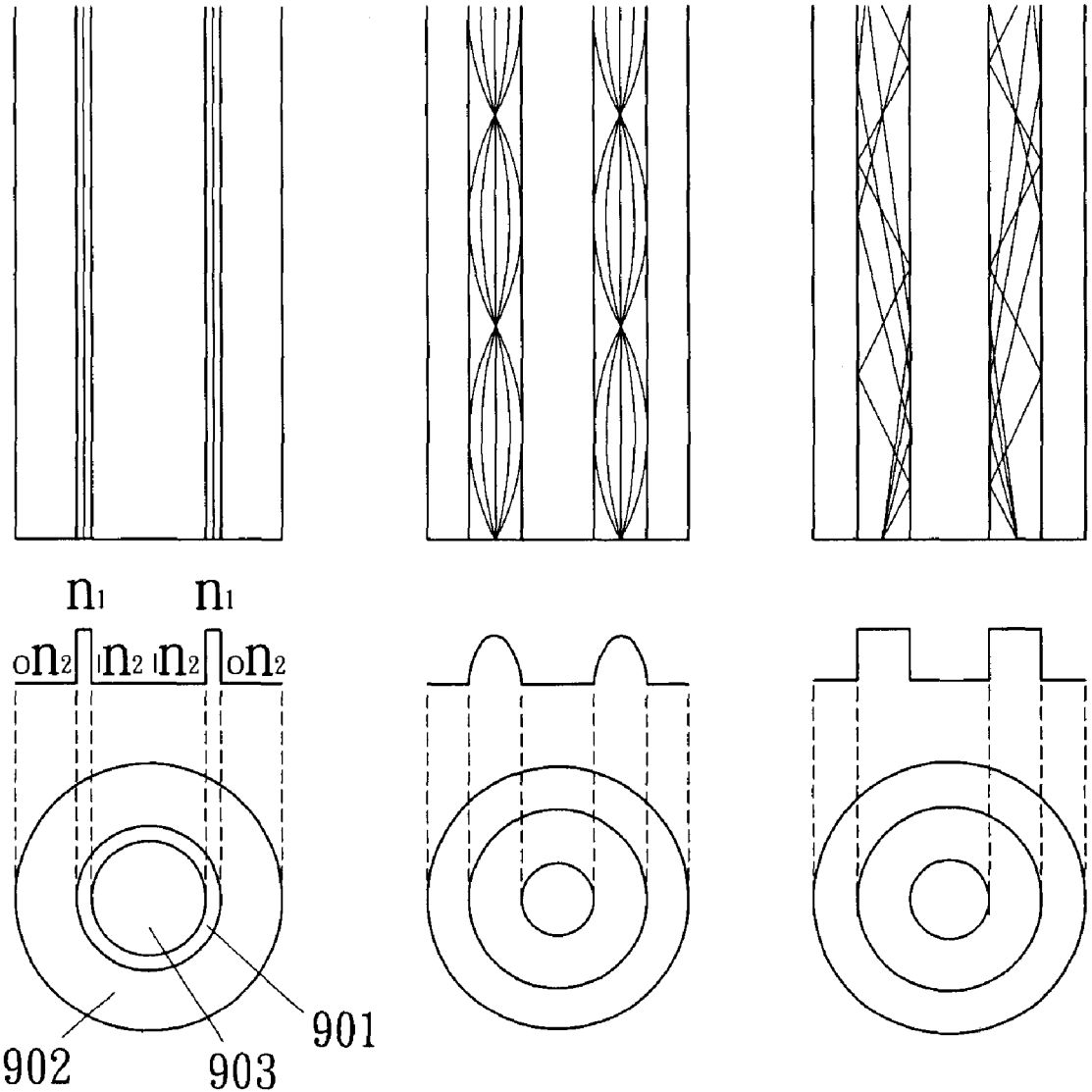
FIG. 9A is a schematic view of a coaxial optical fiber in a single-mode with a step-index.
FIG. 9B is a schematic view of a coaxial optical fiber in a multi-mode with a graded-index.
FIG. 9C is a schematic view of a coaxial optical fiber in a multi-mode with a step-index.
Figure 10A:
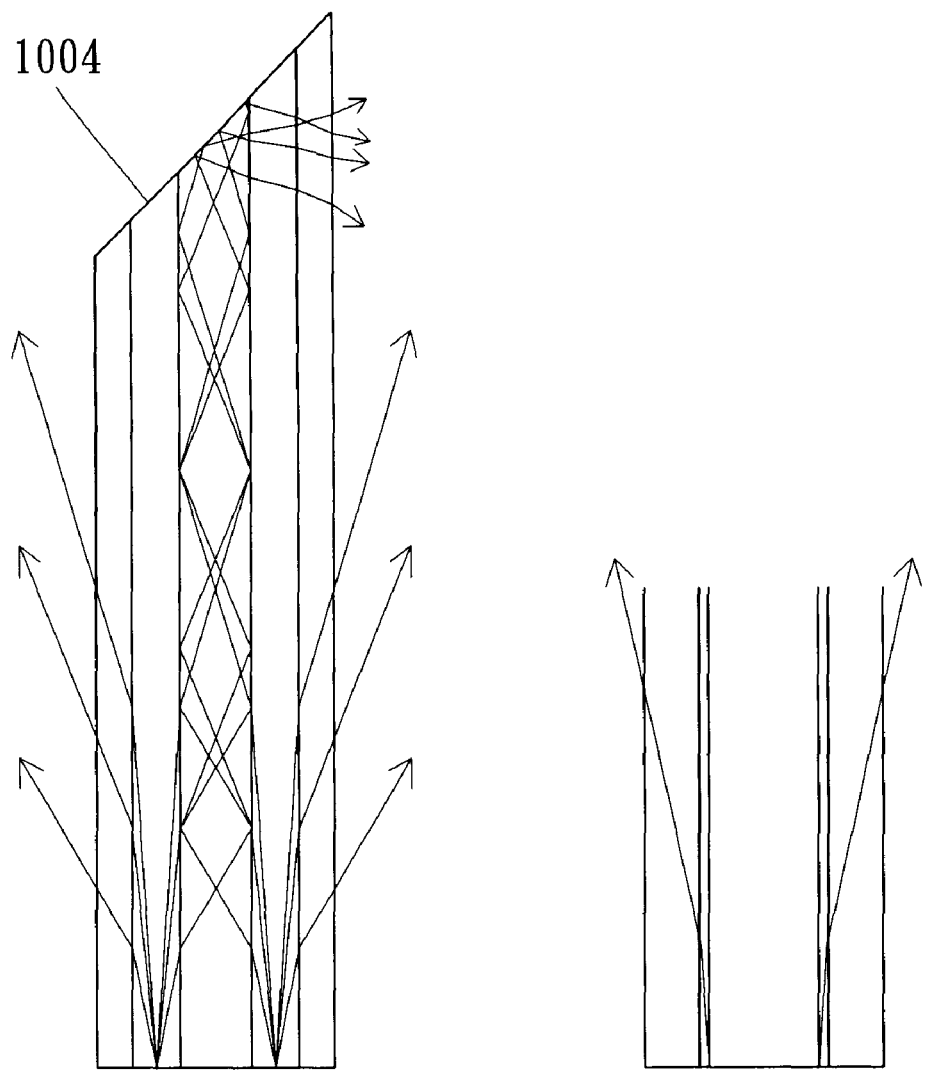
FIG. 10A is a schematic view of the structure of a lighting optical fiber in a multi-mode with a step-index.
Figure 10B:
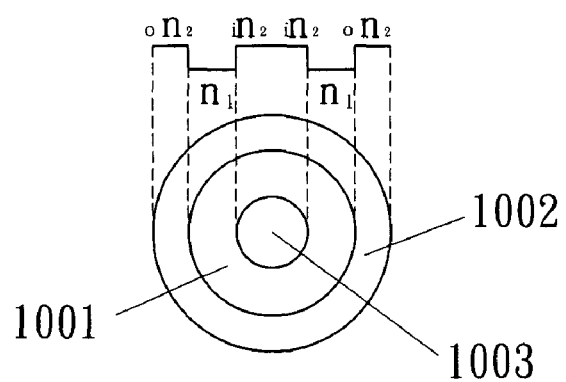
FIG. 10B is a schematic view of the structure of a lighting optical fiber in a single-mode with a step-index.

The laser ingot is formed on the InP base rod. First, provide an epitaxy of $Al_xGa_{1-x}As$ as a P-type annular confinement layer; next provide an epitaxy of GaAs to serve as a P-type active action layer; then provide an epitaxy of $Al_xGa_{1-x}As$ as an N-type confinement layer; and finally deposit a layer of conductive outer ring to serve as a power supply electrode. By means of such a process, ten pieces coaxial line laser ingots can be finished at the same time. In this embodiment, the VLSED-P10 deposition equipment shown in FIG. 7B is adopted. It includes a constant temperature material supply tank controlled by a computer control system to supply various types of commonly used gases. A first quartz duct is taken as an example to serve as a reaction chamber. Other quartz ducts supply the gases in the same way. A constant temperature material supply tank 20 to hold TBAs is provided. The TBAs is vaporized and flows to a flow controller 16 which is controlled by the computer control system to deliver at a desired rate. The TBAs is mixed with other required doping gases such as TMGa 601, TMA1 602, $H_2$ 603 or the like that have to be delivered at a constant amount (for instance, growing InGaAs and InP has to use TEA1 and TEIn, or adopts GaInN family as the fabrication material). The amount of all gas chemical reaction materials are controlled by a flow rate control system and output at a constant quantity in a blender 19 to be mixed. A connector is provided to connect the ten quartz ducts. To simplify discussion of the embodiment, the chassis and thermos tank are omitted in the drawing and discussion. After all the conductor subrods (or InP base rods) that are formed at a diameter of 2 mm and engraved with Bragg's grating and plated with a reflective silver layer have been disposed at the core positions of the quartz ducts, dispose each quartz duct in a chuck 13 which has two ends openable and fastenable and a RF annular anode coil 607. Ten linking RF power generators 11 are provided and arranged in a juxtapose manner to be driven at the same time at selected positions by computer setting so that deposition process of epitaxy is started concurrently at the same up and down distance and the same speed. Each quartz duct has a sensor located and a pressure controller 15 below a fastening connector 14 to perform feedback control. Exhaust gases and un-depositing particles are filtered and jointly processed through a filter and an exhaust gas processor 22 located at a tail end. A common pump 21 is provided to provide a negative pressure condition. In MOCVD process, RF discharge plasma provides energy for discharged ions of the chemical reaction material (also called PECVD). The subrod 606 (or InP base rod) disposed in the center of each quartz duct serves as a cathode and grounded, the RF annular anode coil 607 is movable outside the quartz duct 1 to form a RF plasma stimulating equipment like a resonate cavity applied concurrently with a high voltage electric field. An excessive gas break down field is provided for the gas reaction material flowing between the RF annular anode coil 607 and the subrod 606. As a result, a high voltage arc is generated between the two electrodes. The arc stimulates a great amount of ions and free electrons to generate an annular plasma 608. In the electric field formed between the RF annular anode coil 607 and the subrod 606, the electrons move quickly to the positive anode, the ions move quickly to the negative cathode. As the electrons have a smaller substance, their accelerating speed is more faster than the slow moving ions. The ions move in the quartz reactive duct and finally hit the core electrode and deposit thereon. In the event that a sufficiently high voltage exists between the electrodes, the hitting on the cathode generates second electrons to strike neutral atoms at the upper side or hit molecules in an non-elastic fashion to generate even more ions. The plasma is maintained by release of the secondary electrons and generated ions. The chemical gas material passing through forms epitaxy or deposits on the axial electrode. The RF power generator 11 drives the RF annular anode coil 607 to finish deposition of a coaxial annular semiconductor layer 609. Each RF annular anode coil 607 is positioned upright against the floor and arranged in a juxtaposed manner and movable rapidly up and down at the same time. The annular plasma 608 generated in the quartz duct travels to form a deposited substance which becomes a layer of semiconductor film or a mono-crystal layer of the coaxial line light-emitting diode. The thickness of the deposited epitaxy can be controlled through moving speed, flow amount or flow speed of the reaction materials, temperature pressure, or other process factors. The process mentioned above can be repeatedly performed according to the required thickness of the semiconductor layers or different types of deposition. Finally, deposition process to produce ten pieces of the coaxial line laser ingot at a length of one meter is finished at the same time. The line laser ingots can be removed and cut in sections as required. And a coaxial line laser diode with two ends protected and supplying electric power is formed as shown in FIGS. 8A and 8B. The VLSED method previously discussed uses the engraved Bragg's grating base rod to produce solid state line lasers in a mass production fashion, thus can greatly reduce the cost and provide an intensified light source in large quantity.

Figure 12B:
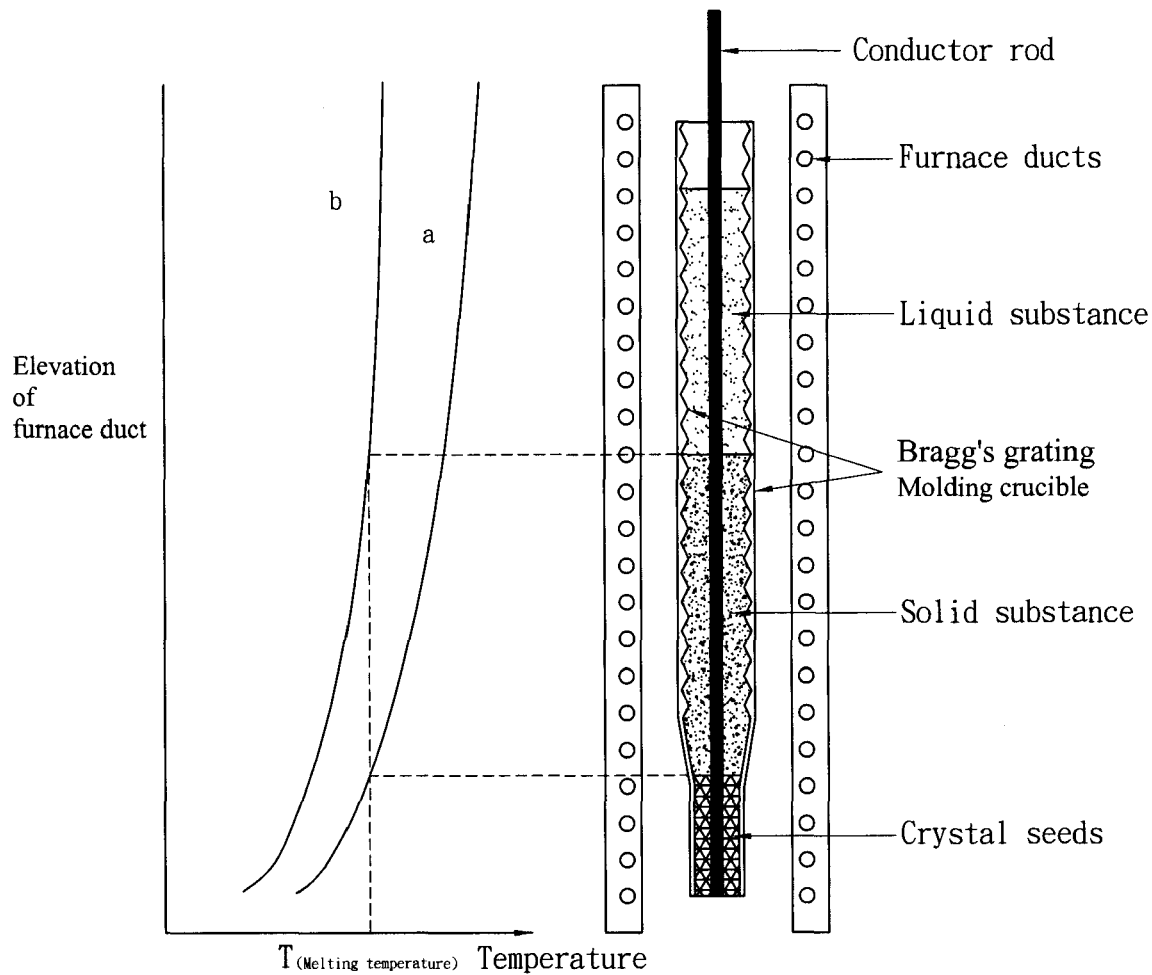
FIG. 12B is a schematic view of fabricating a pre-engraved Bragg's grating axial base rod through the VGF growth method.

The InP base rod has a core conductor engraved with Bragg's grating. The grating may also be formed by etching after the crystal is grown and extracted. The base rod of the InP Bragg's grating may also be fabricated through a composite Bragg's grating crucible as shown in FIG. 12B.

Embodiment 2

The Coaxial Line Laser Diode and the Coaxial Lighting Optical Fiber can be Coupled to Form a Solid State to Provide White-Emitting Luminescence.

Figure 11:
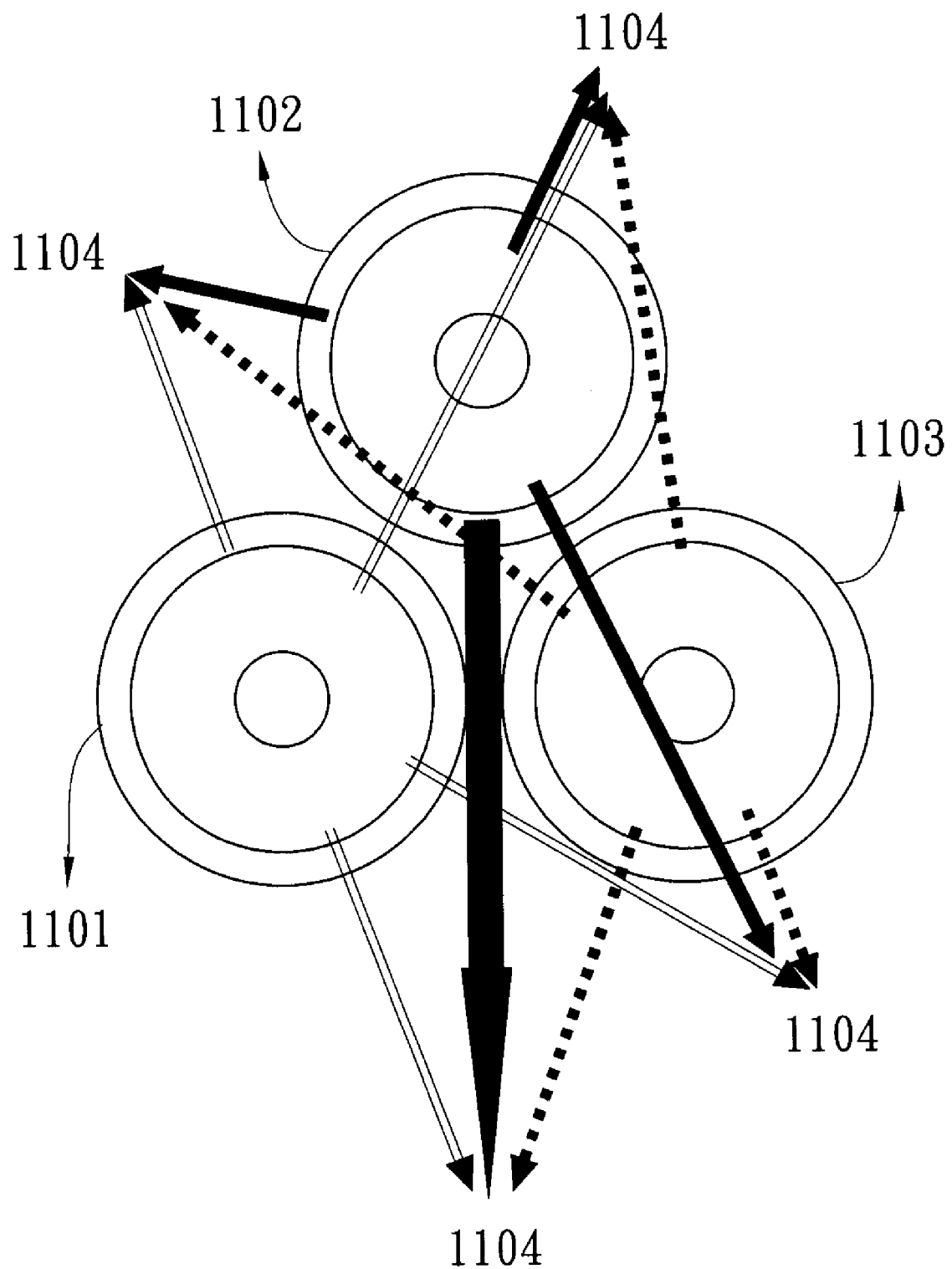
FIG. 11 is a top view of a bundle of lighting optical fibers consisting of three cores of three colors blended to generate white-emitting light.

The embodiment 1 set forth above can also be employed to produce respectively three coaxial line laser diodes for red, green and blue colors. Then they can be coupled with three coaxial lighting optical fibers to blend light and form a solid state while-emitting luminescence device. FIG. 11 shows the top view of three color lighting optical fibers coupled in one bundle to blend and generate white-emitting light, with 1101 for the red lighting fiber, 1102 for the green light fiber, 1103 for the blue light fiber, and 1104 for blending of the three colors to provide white-emitting luminescence. Another alternative is providing a blue light coaxial line laser and a yellow light coaxial line laser to respectively inject light in two coaxial lighting optical fibers arranged in a twin-and-twisted manner that complement with each other to form a solid state white-emitting luminescence device.

Embodiment 3

Figure 13:
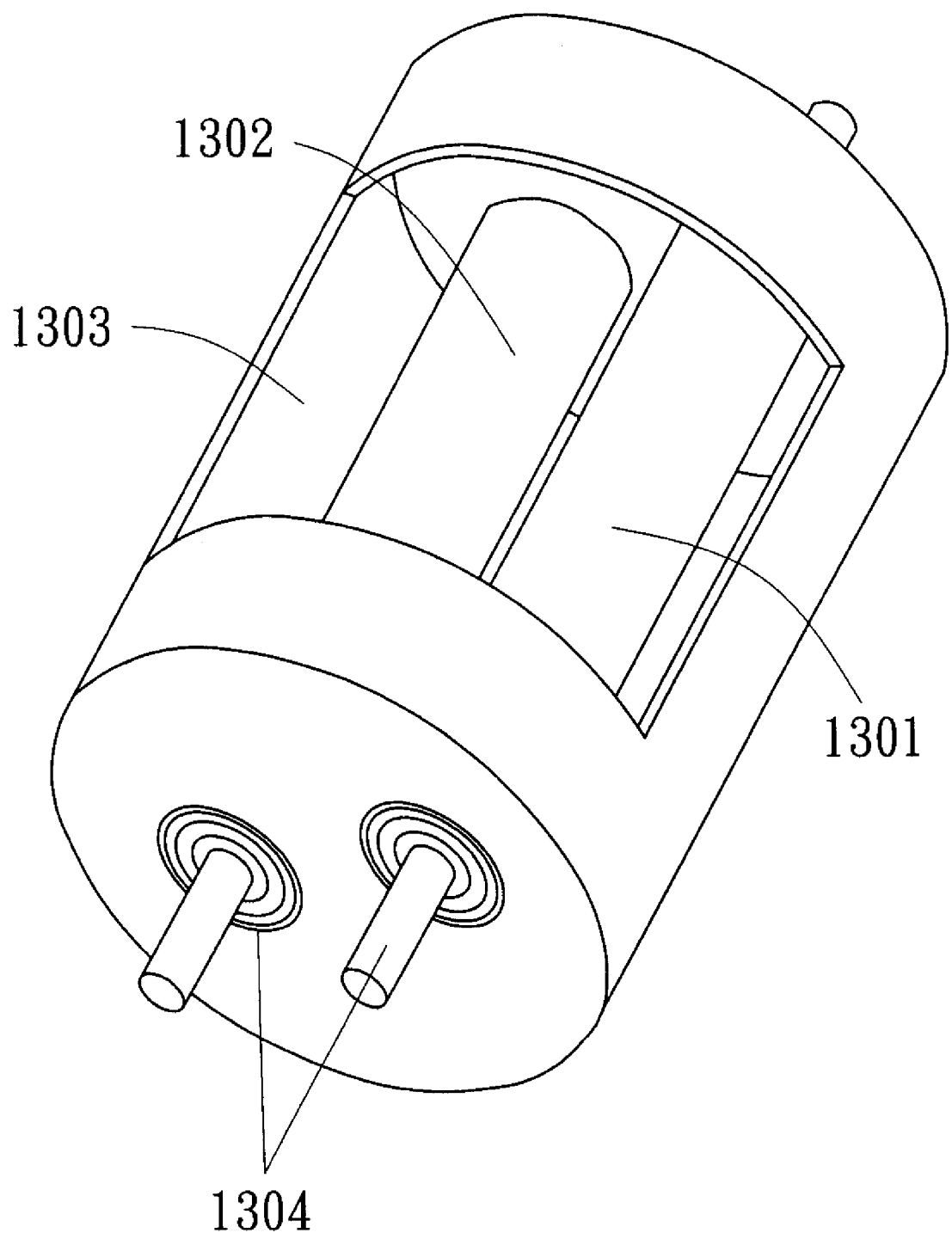
FIG. 13 is a schematic view of a coaxial line laser and a coaxial lighting optical fiber installed in a fluorescent lamp device.

Coaxial Line Laser Diode and Coaxial Lighting Optical Fiber Incorporating with a Fluorescent Set to Form a White-Emitting Luminescence Device Form a sub-assembly by coupling a coaxial line laser diode with a coaxial lighting optical fiber to receive light ejection from the laser diode, and install the sub-assembly in a fluorescent tube, a white-emitting luminescence device can be made as shown in FIG. 13, which includes a blue lighting fiber 1301, a second standby lighting fiber 1302 (for the purpose of forming an adjustable structure by providing an extra lighting color), an inner side coated with yellow phosphor 1303 and power supply sockets 1304 to connect the coaxial line laser diode to an external power source. The lighting optical fibers coupled with the coaxial line laser diodes encased in the tube coated with the phosphor to produce white-emitting luminescence is substantially like the conventional tubular fluorescent lamp coated with phosphor to generate white light. However, the invention has more advantages such as no need to fill ionized gases and no need to provide a high voltage for the ionized gases. By adding the phosphor to the conventional LED, a solid state illumination means can be made. The basic approach is to add phosphor into an LED, such as a blue light LED and yellow phosphor YAG: Ce (with chemical composition of $(Y_{1-a}Gd_a)_3(Al_{1-b}Ga_b)O_{12}$). When the blue light of a wave length 465 nm is provided to stimulate the phosphor YAG: Ce, a yellow light with a spectrum of 555 nm is generated. The yellow light is blended with the blue light not absorbed by the LED to form white light. This is the simplest type, and called 1-PCLED (Phosphor Converted LED). The LED stimulated phosphor approach mentioned above is workable on more LEDs such as two, three, four or even five sets to stimulate one, two or more phosphors of varying lighting colors to accomplish white-emitting luminescence purpose. The combination alternatives previously discussed can be adjusted to generate the white-emitting luminescence with optimal characteristics, such as CRI (Color Rendering index, with unit Ra), CCT (Correlated Color Temperature, K), Luminous Efficacy, (lm/W) and the like. Other alternatives also are available, such as an LED of violet light or ultra violet light incorporates with phosphor to generate white-emitting luminescence. This embodiment replaces the coaxial line LED with two pieces of coaxial line laser diodes such as blue light coaxial line laser or one coaxial line laser with an enhanced CRI to respectively inject light in two coaxial lighting optical fibers, then is encased in a tube with yellow phosphor coated inside to form an elongate white-emitting luminescence device. As the invention provides a line lighting layer at a sufficient length, a longer and larger luminous area can be obtained. The coaxial line laser structure thus formed can generate a greater light intensity and luminous efficacy to displace the conventional fluorescent lamp.

Embodiment 4

Laser Gun

Figure 14:
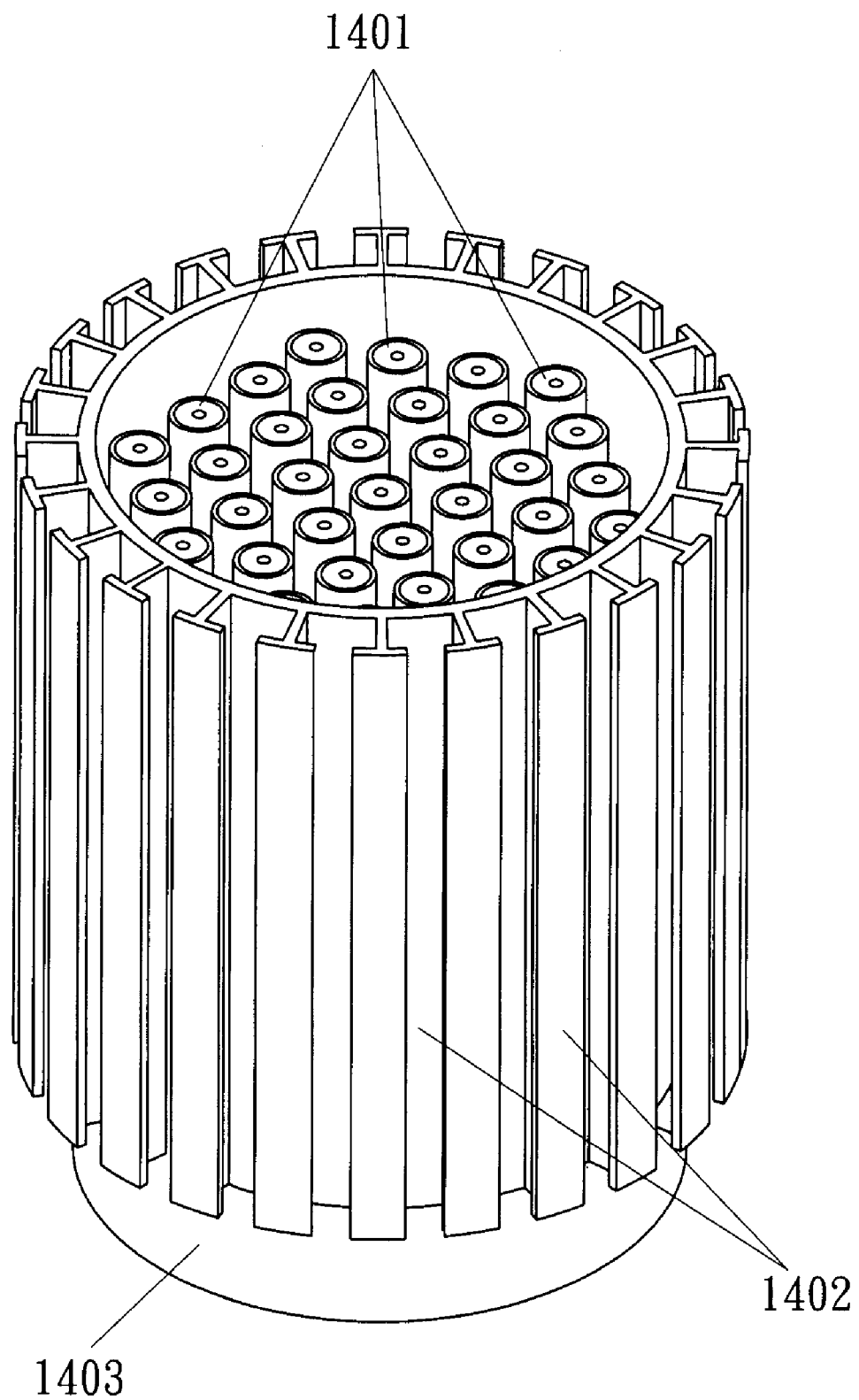
FIG. 14 is a perspective view of a laser gun light source element.

The coaxial line laser diode can be clustered to form a bundle emission structure and become a solid state high energy light source, or called a laser gun. FIG. 14 illustrates another embodiment of the invention to function as a light source element for a laser gun. It includes a bundle of pillar-like coaxial line laser diodes 1401 held in an elongate tube 1402 which provides cooling and protection, then is mounted onto a battery and a control circuit chassis 1403 to become a laser gun. The laser gun thus formed has 36 sets of coaxial line lasers bundled together. They have respectively an outer annular electrode at a same potential (such as a grounded negative electrode). Assumed that each coaxial line laser can emit power of one watt, total 36 watts can be generated and concentrated at a very small area to perform work and produce huge effect. The purpose of power concentration is depending on used wave length and type. The number and length of the bundled line lasers can be increased to amplify power multiple times to meet use requirements. As the coaxial line laser is formed at a very small diameter, increasing the number does not significantly enlarge the tubular diameter of the entire body and affect portability.

In the event that the shooting target is located at a long distance, a focusing means can be installed at the front side, or a mechanical focusing control means can be provided to facility straight emission of laser light and light adjustment, therefore to get more accurate and intensified light, or converge heat at a higher temperature. Furthermore, the coaxial light source structure can be fabricated at a greater length, and the line laser can be fabricated easier at a smaller size and lighter weight to improve portability. With the front end coupling with the coaxial light guide optical fiber, it can become an instrument used in medical treatment or body grooming and enhancement. The invention provides simpler operation and can accurately control injection spots or surface, thus also can be used in industries or detection and exploration, therefore is a desirable accessory of weapons to enhance military combat power. For safety reasons, it is requested to defer, forbid or put a check on publication of the laser gun portion for eighteen months.

In the embodiments previously discussed elements marked with numerals can be deemed to provide same or similar functions. The drawings mainly aim to simplify explanation of the features of the invention. The number and size of the elements are not made or drawn according to actual dimensional ratios, but based on the basic principle of the coaxial line laser diode.

In addition, the coaxial line laser diodes and the lighting devices formed therewith depicted in the embodiments and the drawings aim to represent the main principle of the coaxial semiconductor light source structure of the invention. It is adaptable to other types of coaxial light emission functions and applications.

Based on the embodiments set forth above, the coaxial line laser diode and coaxial lighting optical fiber of the invention can be coupled and arranged to form various types solid state white-emitting luminescence devices. The fabrication method also is included and can be adopted easily. Adopted such a method, the coaxial line laser ingot can be made at a greater length and provide desired characteristics such as a higher luminous efficacy (lm/W) and enhanced light intensity (lm/lamp) through a single fabrication process. The lighting products adopted the invention can be adapted to a wide variety of applications at a lower cost. The coaxial structure also can save electric power and energy resources.

It is to be noted that the function provided by each element and the coaxial light emission function, it provides also can be maintained when two or more such elements are employed. The coaxial structure can be mass produced at the same time. The elements provided by the invention can be deployed individually or jointly in various types of coaxial-included light emission systems and fabrication systems different from the ones previously discussed to provide more benefits to mankind.

While the specification of the invention is mainly based on a solid state white-emitting luminescence structure consisting of coaxial line laser diodes and coaxial lighting optical fibers, it aims to facilitate discussion of the invention, and is not the limitation of the invention. Modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A line coaxial laser diode having a semiconductor light source structure formed by extending the axial length of the coaxial laser diode, comprising:
   a coaxial axial electrode to supply electricity, an outer annular conductor, and
   a plurality of coaxial annular semiconductor layers located therebetween to generate axial direction stimulated emission through laser amplification, wherein the coaxial annular semiconductor layers comprise a $P^+$-type semiconductor layer formed on the coaxial axial electrode, a P-type annular confinement layer formed on the $P^+$-type semiconductor layer, a P-type active action layer formed on the P-type annular confinement layer and an N-type confinement layer formed on the P-type annular active action layer, and the coaxial line laser diode receives a coaxial annular Bragg's grating feedback function distributed axially at an extended length.

2. The line coaxial laser diode of claim 1, wherein the line coaxial laser diode is clustered in a great number in a bundle in a parallel and juxtaposed fashion to generate intensified light.

3. The line coaxial laser diode of claim 1, wherein the line coaxial laser diode is clustered in a great number densely in a bundle in a parallel and juxtaposed fashion and formed on a thick wafer to generate intensified light.

* * * * *